(12) United States Patent
Takeda (10) Patent No.: US 8,507,807 B2
(45) Date of Patent: Aug. 13, 2013

(54) WIRING BOARD

(75) Inventor: Tsutomu Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 367 days.

(21) Appl. No.: 13/024,897

(22) Filed: Feb. 10, 2011

(65) Prior Publication Data

US 2011/0226516 A1    Sep. 22, 2011

(30) Foreign Application Priority Data

Mar. 17, 2010    (JP) .................................. 2010-061227

(51) Int. Cl.
*H05K 1/11*    (2006.01)
(52) U.S. Cl.
USPC ........................................................ 174/262
(58) Field of Classification Search
USPC ........................... 174/262–266; 361/792–795
See application file for complete search history.

(56) References Cited

U.S. PATENT DOCUMENTS 5,347,712 A * 9/1994 Yasuda et al. .................. 29/852
6,479,764 B1 * 11/2002 Frana et al. .................... 174/262

FOREIGN PATENT DOCUMENTS

| JP | 5-327172 A | 12/1993 |
| JP | 9-172261 A | 6/1997 |
| JP | 10-273254 A | 10/1998 |
| JP | 2005183649 A | 7/2005 |
| JP | 2008028188 A | 2/2008 |

* cited by examiner

*Primary Examiner* — Jeremy Norris (57) ABSTRACT

A wiring board includes at least one signal layer, at least one ground layer, at least one power plane, at least one power supply via that electrically conducts wiring over one substrate surface where a semiconductor device chip is mounted, wiring over another substrate surface, and the power plane, and signal wiring for performing signal transmission between a plurality of semiconductor device chips. The power plane is placed to the one substrate surface side than the signal wiring. The power supply via is composed of a large diameter aperture and a small diameter aperture. The large diameter aperture has a relatively large diameter and is formed from the one substrate surface to the power plane, and the small diameter aperture has a relatively small diameter and is formed from the power plane to the other substrate surface.

2 Claims, 14 Drawing Sheets

| Lay | Thickness (mm) | Thickness (um) | | Lay | Thickness (mm) | Thickness (um) | |
|---|---|---|---|---|---|---|---|
| 1 | | 50 | Signal | 1 | | 50 | Signal |
| | 0.100 | | | | 0.100 | | |
| 2 | | 35 | GND | 2 | | 35 | GND |
| | 0.100 | | | | 0.100 | | |
| 3 | | 35 | POWER PLANE | 3 | | 35 | Signal |
| | 0.100 | | | | 0.100 | | |
| 4 | | 35 | POWER PLANE | 4 | | 35 | GND |
| | 0.100 | | | | 0.100 | | |
| 5 | | 35 | GND | 5 | | 35 | Signal |
| | 0.100 | | | | 0.100 | | |
| 6 | | 35 | Signal | 6 | | 35 | GND |
| | 0.100 | | | | 0.100 | | |
| 7 | | 35 | GND | 7 | | 35 | POWER PLANE |
| | 0.100 | | | | 0.100 | | |
| 8 | | 35 | Signal | 8 | | 35 | POWER PLANE |
| | 0.100 | | | | 0.100 | | |
| 9 | | 35 | GND | 9 | | 35 | GND |
| | 0.100 | | | | 0.100 | | |
| 10 | | 35 | Signal | 10 | | 35 | Signal |
| | 0.100 | | | | 0.100 | | |
| 11 | | 35 | GND | 11 | | 35 | GND |
| | 0.100 | | | | 0.100 | | |
| 12 | | 35 | Signal | 12 | | 35 | Signal |
| | 0.100 | | | | 0.100 | | |
| 13 | | 35 | GND | 13 | | 35 | GND |
| | 0.100 | | | | 0.100 | | |
| 14 | | 50 | Signal | 14 | | 50 | Signal |

Fig. 8

WIRING BOARD

CROSS-REFERENCE TO RELATED APPLICATIONS

This application is based upon and claims the benefit of priority from Japanese patent application No. 2010-61227, filed on Mar. 17, 2010, the disclosure of which is incorporated herein in its entirety by reference.

BACKGROUND

The present invention relates to a wiring board.

Figure 7:
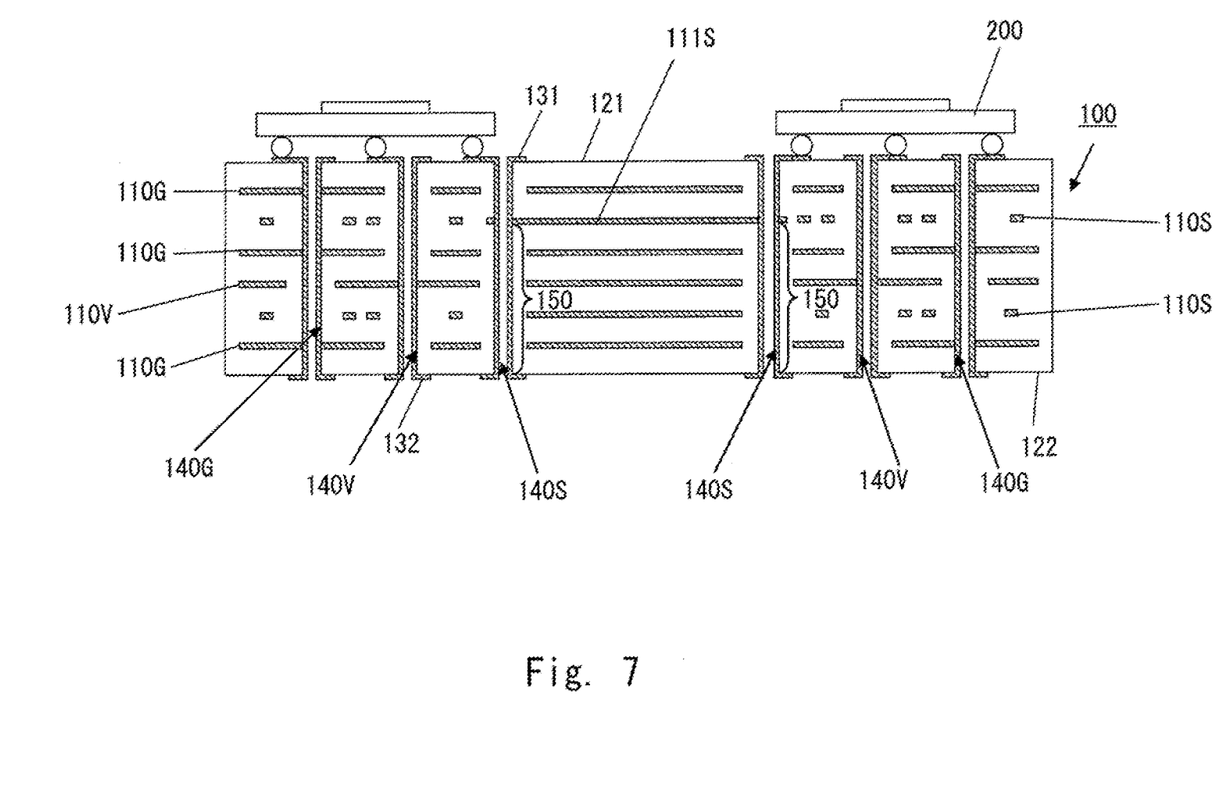
FIG. 7 is an overall cross-sectional diagram of a wiring board according to a related art.

FIG. 7 is a cross-sectional diagram showing an example of a configuration of a multilayer printed wiring board according to a related art.

Inside a wiring board shown in FIG. 7, at least one signal layer (Signal) 110S, at least one ground layer (GND) 110G, and at least one power plane (POWER PLANE) 110V are laminated with insulating layers (numerals omitted) interposed therebetween. A plurality of semiconductor packages 200 accommodating semiconductor device chips, such as LSI, are mounted over one substrate surface 121 (top surface of FIG. 7) of the wiring board 100. In the example shown, the semiconductor package 200 is a BGA (Ball Grid Array) package.

Inside the wiring board 100, there are at least one signal via 140S, composed of an opening in which an inner wall surface thereof is covered by a conductive material, that electrically conducts wiring 131 over one substrate surface 121 where a semiconductor package 200 is mounted, wiring 132 over the other substrate surface 122, and the signal layer 110S, at least one grand via 140G, composed of an opening in which an inner wall surface thereof is covered by the conductive material, that electrically conducts the wiring 131 over one substrate surface 121 where the semiconductor package 200 is mounted, the wiring 132 over the other substrate surface 122, and the ground layer 110G, and at least one power supply via 140V, composed of an opening in which an inner wall surface thereof is covered by the conductive material, that electrically conducts the wiring 131 over one substrate surface 121 where the semiconductor package 200 is mounted, the wiring 132 over the other substrate surface 122, and the power plane 110V.

A signal wiring 111S is formed inside the signal layer 110S of the wiring board 100. The signal wiring 111S performs signal transmission between the semiconductor packages 200.

As shown in FIG. 7, in the related art, the signal wiring 111S is disposed over the substrate surface 121 side where the semiconductor package 200 is mounted, and the power plane 110V is disposed below the signal wiring 111S. In this configuration, the section of the signal via 140S below the signal wiring 111S will be a stub 150, and parasitic capacitance divided from a signal transmission path is generated (see paragraph 0005 and FIGS. 4A and 4B of Japanese Unexamined Patent Application Publication No. 2005-183649). In the interface with transmission speed of Gbps or more, the parasitic capacitance generates waveform rounding due to this stub, which will be an obstacle in high-speed signal transmission.

Figure 8:
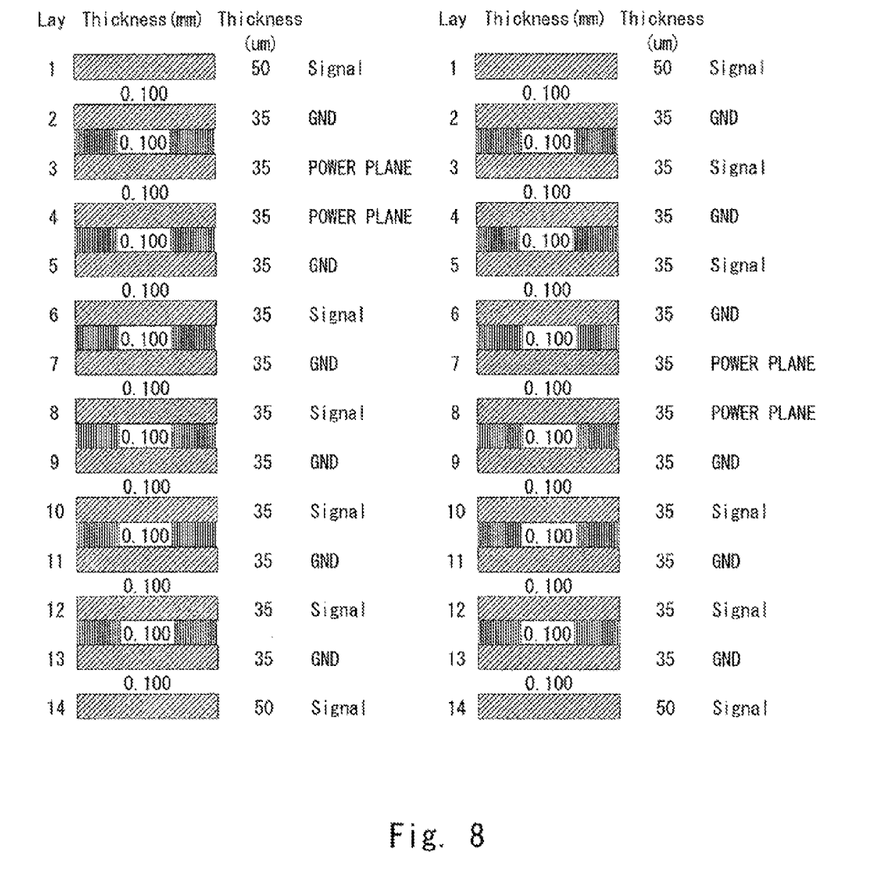
FIG. 8 illustrates a wiring example inside the wiring board.

Therefore, it has been suggested that the power plane is disposed near the substrate surface where a semiconductor device chip is mounted, signal wiring is disposed at a position as far as possible from the substrate surface where the semiconductor device chip is mounted, and the stub is shortened (see FIG. 3B in Japanese Unexamined Patent Application Publication No. 2005-183649, the signal wiring is denoted by the numeral 2). In the wiring board shown in the left and right diagrams of FIG. 8, the number of wiring layers is the same. However in the wiring board of the left diagram, a power plane is placed over the substrate surface where the semiconductor device chip is mounted.

The related arts of the present invention are; Japanese Unexamined Patent Application Publication Nos. H10-273254, H05-327172, H09-172261, and 2008-028188. The details of the related arts are described later.

In the wiring board, the section lower than the power plane of the power supply via is not actually required. The present inventor has found a problem that specially in the wiring board shown in the left diagram of FIG. 8 in which the power plane is disposed near the substrate surface where the semiconductor device chip is mounted, the section lower than the power plane of the power supply via occupies a large ratio and the existence thereof causes deterioration of wirability.

Especially when a high-density BGA package, which has solder balls (BGA terminals) pitched at 1.0 mm or less, is mounted, the pitch of the power supply via is small and the wiring design of the signal layer lower than the power plane and the other substrate surface side is limited.

With specific numeric values, if a BGA package of 1.0 mm pitch is mounted to a printed wiring board of 2.5 mm thickness, the hole diameter of the power supply via hole is 0.2 to 0.3 mm, the diameter of the via land provided on the other substrate surface side is about 0.4 to 0.6 mm, and the gap between adjacent via lands is about 0.4 to 0.6 mm. In this case, if two lines are placed between the adjacent via lands, the line width is about 100 μm at the maximum. Therefore, there are limitations in the number of channels and line width of the wiring on the signal layer lower than the power plane and the other substrate surface, thus there may be a mismatch in the impedance.

If the hole diameter of the power supply via is reduced, the pitch of the power supply via can be increased, and reservation of the number of wiring channels or impedance matching will be easy, but the resistance value of the power supply via increases and will be an obstacle in the power supply. Further, if the aspect ratio of the power supply via increases, it will be difficult to open the power supply via. Specifically, if the aspect ratio of the power supply via exceeds 20, it will be difficult to open the power supply via. For example, with the printed wiring board of 2.5 mm thickness, it is difficult to open a through hole with a 0.1 mm diameter (aspect ratio 25), relatively difficult to open a through hole with a 0.15 mm diameter (aspect ratio 16.6), and relatively easy to open a through hole with a 0.2 mm diameter (aspect ratio 12.5).

SUMMARY

The present invention is made in light of the above mentioned circumstances, an object is to provide a wiring board that has higher wiring design flexibility and can obtain favorable impedance matching without increasing the resistance value of the power supply via.

An aspect of the present invention is a wiring board that includes at least one signal layer, at least one ground layer, at least one power plane, at least one power supply via that is composed of an opening in which an inner wall surface is covered by a conductive material, in which the power supply via electrically conducts wiring over one substrate surface where at least one semiconductor device chip is mounted, wiring over another substrate surface, and the power plane, and signal wiring for performing signal transmission between a plurality of semiconductor device chips. The power plane is placed to the one substrate surface side than the signal wiring, and the power supply via is composed of a large diameter aperture and a small diameter aperture. The large diameter aperture has a relatively large diameter and is formed from the one substrate surface to the power plane, and the small diameter aperture has a relatively small diameter and is formed from the power plane to the other substrate surface.

In the wiring board of the present invention, "signal wiring" may be the one that performs signal transmission between the plurality of semiconductor device chips which are mounted over the wiring board of the present invention, or may be the one that performs signal transmission between at least one semiconductor device chip which is mounted over the wiring board of the present invention and at least one semiconductor device chip which is separately mounted.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
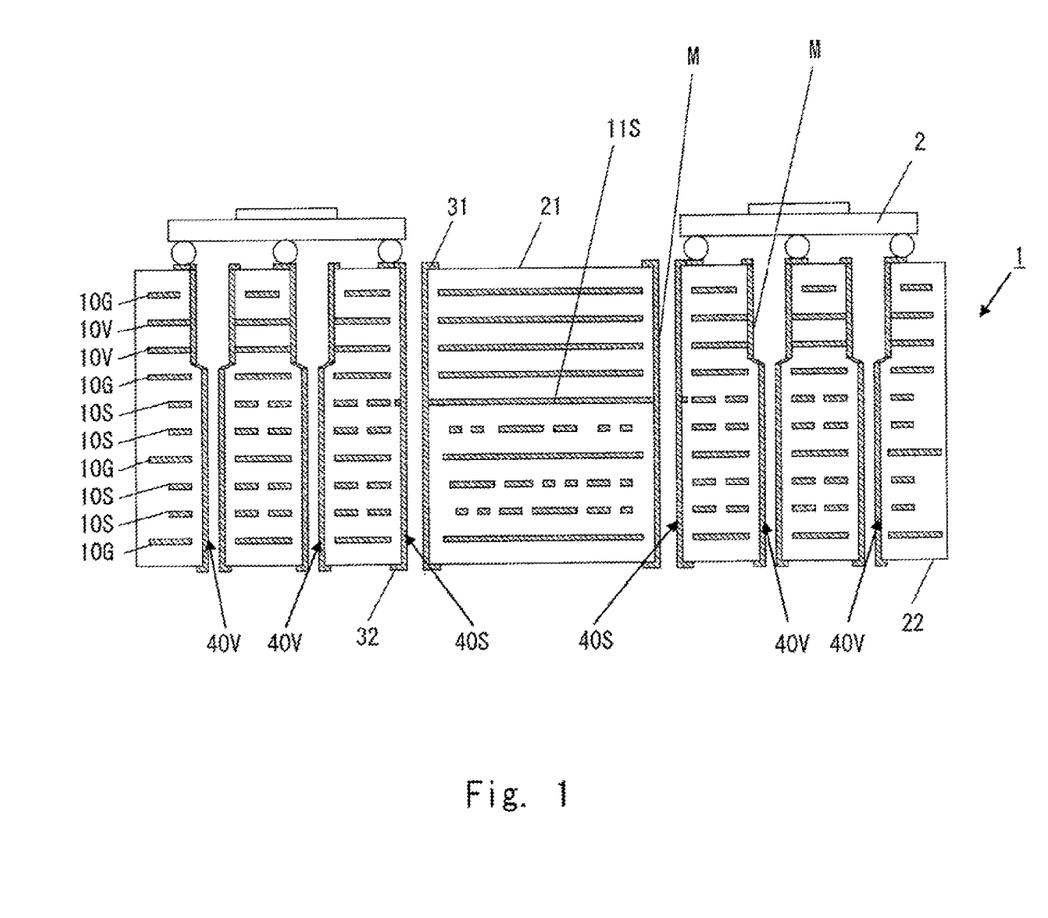
FIG. 1 is an overall cross-sectional diagram of a wiring board according to a first embodiment of the present invention.
Figure 2:
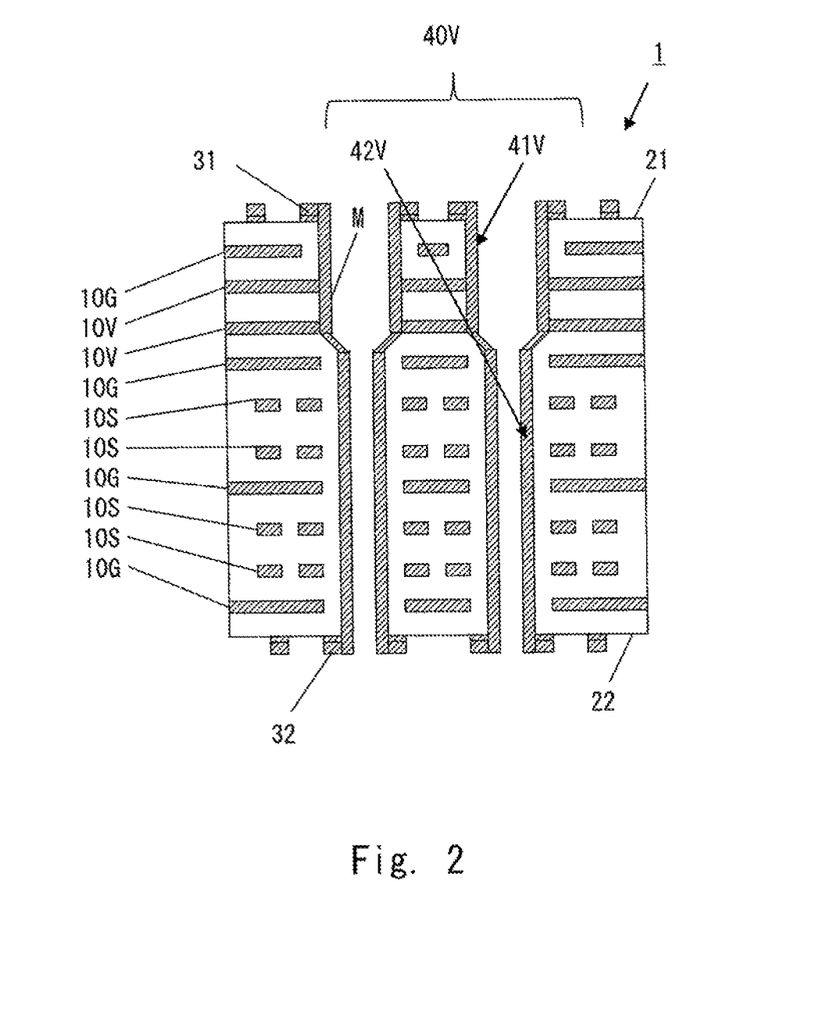
FIG. 2 is an enlarged view of FIG. 1.

A multilayer printed wiring board according to a first embodiment of the present invention is explained with reference to the drawings. FIG. 1 is an overall cross-sectional diagram of the wiring board according to this embodiment. FIG. 2 is an enlarged view. FIGS. 3A to 3D are flow diagrams. For better visibility, the scale of each component is changed as appropriate from actual scale.

As shown in FIGS. 1 and 2, at least one signal layer (Signal) 10S, a plurality of ground layers (GND) 10G, and at least one power planes (POWER PLANE) 10V are laminated via insulating layers (numerals omitted) interposed therebetween. In the illustrated example, a plurality of signal layers 10S, a plurality of ground layers 10G, and a plurality of power planes 10V are formed inside a wiring board 1.

As shown in FIG. 1, at least one semiconductor package 2 accommodating a semiconductor device chip, such as LSI, is mounted over one substrate surface 21 side (top surface of the drawing) of the wiring board 1. In the illustrated example, the semiconductor package 2 is a BGA (Ball grid array) package.

In this embodiment, the semiconductor package 2 may be a PGA (Pin Grid Array) package, a LGA (Land Grid Array) package or the like.

Inside the wiring board 1, there are at least one signal via 40S, composed of an opening in which an inner wall surface thereof is covered by a conductive material M, that electrically conducts wiring (this wiring is also a signal layer) 31 over one substrate surface 21 where a semiconductor package 2 is mounted, wiring 32 (this wiring is also a signal layer) over the other substrate surface 22, and the signal layer 10S, at least one ground via (not shown), composed of an opening in which an inner wall surface thereof is covered by the conductive material M, that electrically conducts the wiring 31 over one substrate surface 21 where the semiconductor package 2 is mounted, the wiring 32 over the other substrate surface 22, and the ground plane 10G, and at least one power supply via, composed of an opening in which an inner wall surface thereof is covered by the conductive material M, that electrically conducts the wiring 31 over one substrate surface 21 where the semiconductor package 2 is mounted, the wiring 32 over the other substrate surface 22, and the power plane 10V.

In the signal layer 10S of the wiring board 1, there is signal wiring 11S for performing signal transmission between the plurality of semiconductor packages 2.

In this embodiment, in a similar manner as the related art, the signal via 40S and the grand via (not shown) are straight apertures formed with the same diameter from one substrate surface 21 to the other substrate 22. On the other hand, as shown in FIG. 2, the power supply via 40V is composed of a large diameter aperture 41V with a relatively large diameter formed from one substrate surface 21 to the power plane 10V, and a small diameter aperture 42V with a relatively small diameter formed from the power plane 10V to the other substrate surface 22.

The manufacturing method of the wiring board 1 of this embodiment is explained with reference to FIGS. 3A to 3D.

Figure 3A:
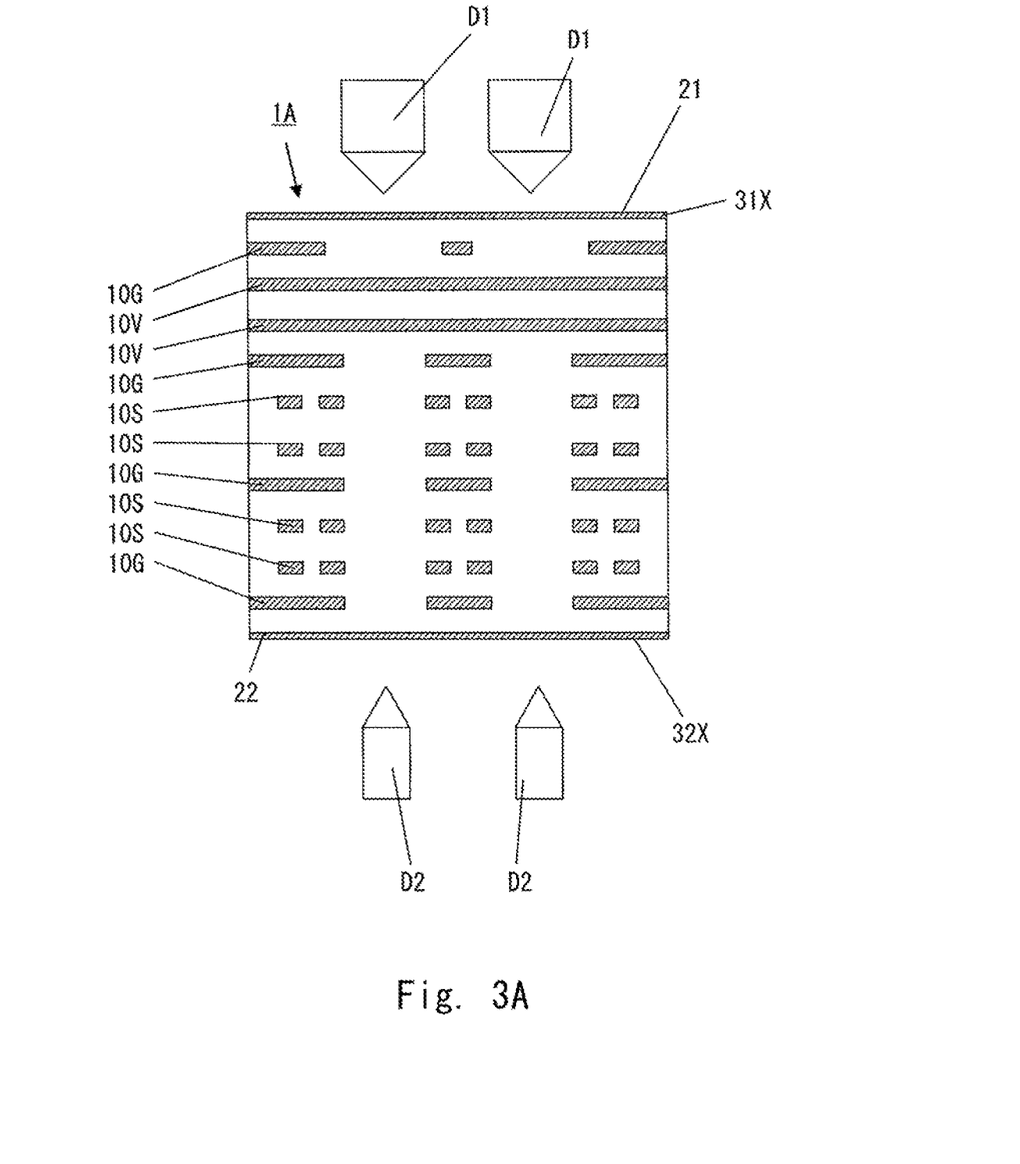
FIG. 3A is a flow diagram.

As shown in FIG. 3A, a wiring board 1A is prepared which includes at least one signal layer 10S, at least one ground layer 10G, and at least one power plane 10V. No via is formed in the wiring board 1A, but an unpatterned wiring layer 31X is formed to one substrate surface 21, and an unpatterned wiring layer 32X is formed to the other substrate surface 22.

Next, straight apertures are opened using a drill corresponding each hole diameter at the formation point of the signal via 40S and the grand via (not shown) of the wiring board 1A (not shown in the drawing).

Figure 3B:
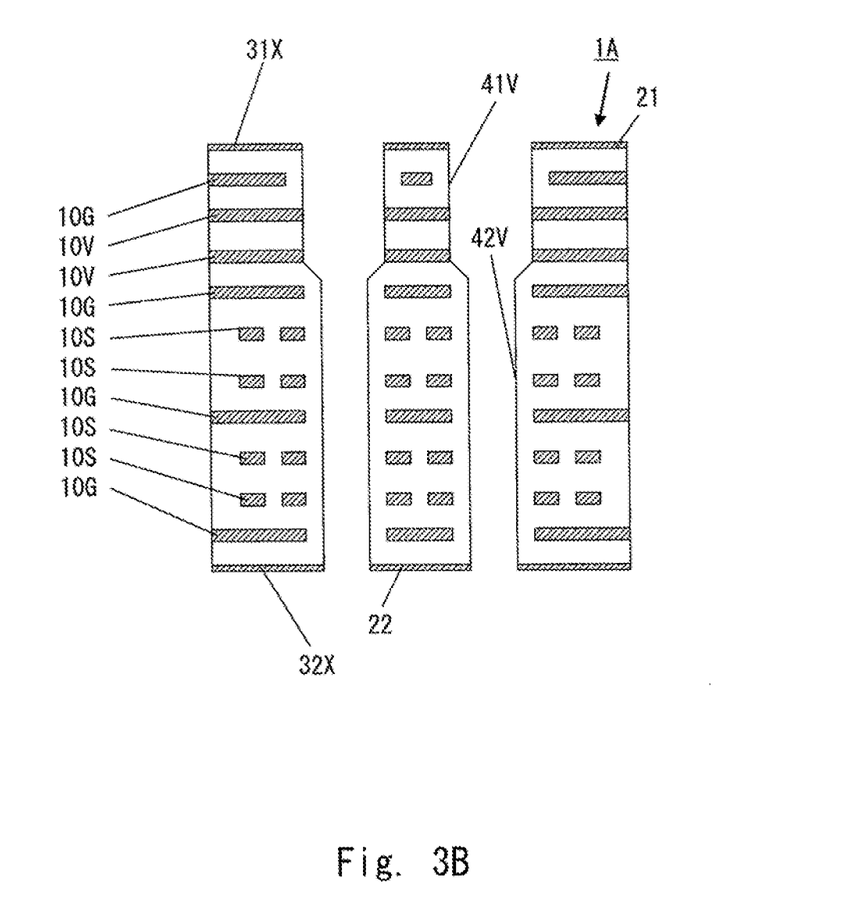
FIG. 3B is a flow diagram.

Next, as shown in FIGS. 3A and 3B, the large diameter aperture 41V reaching to the power plane 10V from one substrate 21 is opened from one substrate surface 21 side at the formation point of the power supply via 40V of the wiring board 1A using a drill D1 with the same outer diameter as the inner diameter of the large diameter aperture 41.

Next, as shown in FIGS. 3A and 3B, the small diameter aperture 42V is opened from the other substrate surface 22 side using a drill D2 with the same outer diameter as the inner diameter of the small diameter aperture 42V at the formation point of the power supply via 40V of the wiring board 1A.

The opening order of the aperture for the signal via 40S, the aperture for the grand via (not shown), and the aperture for the power supply via 40V, is not limited to above but can be changed as appropriate.

Figure 3C:
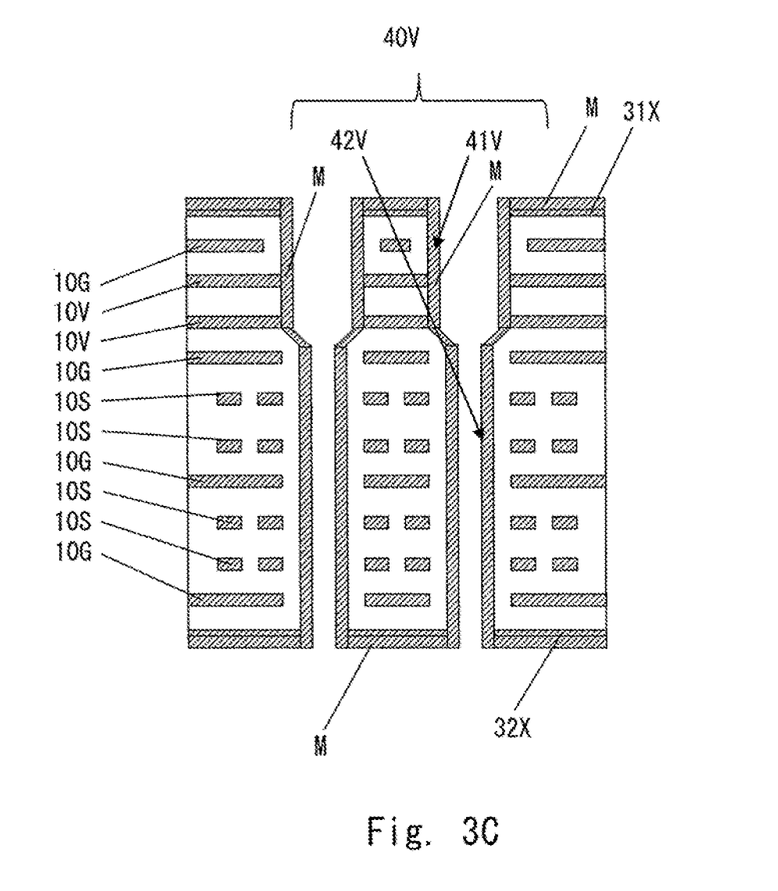
FIG. 3C is a flow diagram.

Next, as shown in FIG. 3C, the conductive material M is plated over the inner wall surface of the aperture for the signal via 40S, the aperture for the ground via (not shown), and the aperture for the power supply via 40V so as to form the signal via 40S, the ground via, and the power supply via 40V. In this process, the conductive material M is plated over the wiring layers 31X and 32X over the substrate surfaces 21 and 22.

Figure 3D:
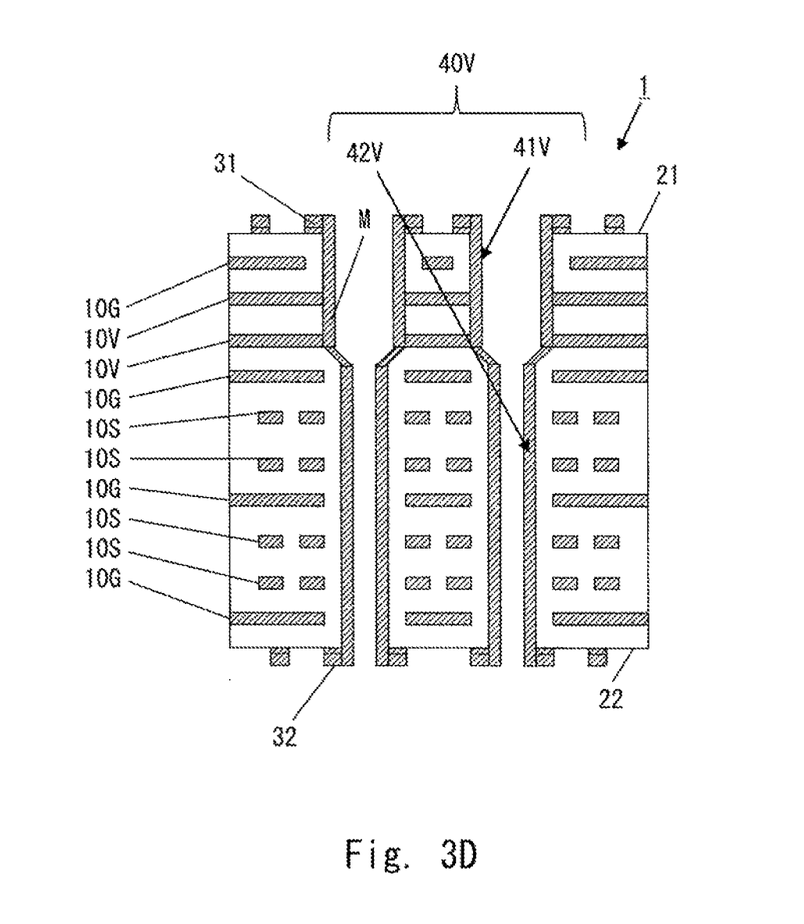
FIG. 3D is a flow diagram.

Lastly, as shown in FIG. 3D, a stack composed of the wiring layer 31X and the conductive material M, and a stack composed of the wiring layer 32X and the conductive material M are patterned so as to form the wiring 31 and 32 over the substrate surfaces 21 and 22.

The wiring board 1 is manufactured as described above.

In the wiring board 1 of this embodiment, the power supply via 40V is composed of the large diameter aperture 41V with the relatively large diameter formed from one substrate surface 21 to the power plane 10V, and the small diameter aperture 42V with the relatively small diameter formed from the power plane 10V to the other substrate surface 22.

In the above configuration, as the diameter of the power supply via 40V from one substrate surface 21 to the power plane 10V can be large, the resistance value of the power supply via 40V, which is a feed line, can be reduced, which is advantageous for power supply.

On the other hand, as the diameter of the power supply via 40V is small below the power plane 10V (from the power plane 10V to the other substrate surface 22), the gap between the adjacent power supply vias 40V can be wide. Therefore, the flexibility of the wiring design of the signal layer 10S below the power plane 10V and over the other substrate surface 22 is high. Thus it is easy to match the impedance by reserving the number of wiring channels and increasing the wiring width.

The power supply via 40V composed of the large diameter aperture 41V and the small diameter aperture 42V can be easily formed by opening the apertures using two kinds of the drills D1 and D2 with different diameters from the substrate surfaces 21 and 22 sides. At this time, as a part of the power supply via 40V is the large diameter aperture 41V, even if there is a slight deviation in the center of the large diameter aperture 41V and the small diameter aperture 42V, penetrating apertures can be easily formed. Further, in the abovementioned method, as the apertures are formed from both substrate surfaces 21 and 22, the aspect ratio of the part to be opened at a time is smaller than the case of opening the apertures from only one side of the substrate surface. Therefore, drill shooting is suppressed and the improvement effect of the yield is also obtained. Accordingly, the manufacturability of the wiring board 1 of this embodiment is also better than before.

The diameter x of the large diameter aperture 41V, the diameter y of the small diameter aperture 42V, and the ratio x/y of the diameter of the large diameter aperture 41V and the small diameter aperture 42V are designed as appropriate and not especially limited.

The larger the diameter x of the large diameter aperture, the larger the effect of resistance reduction of the feed line. The smaller the diameter y of the small diameter aperture 42V, the larger the effect of the improvement in wirability and impedance matching.

In this embodiment, as the apertures are formed from both of the substrate surfaces 21 and 22, the aspect ratio of the part to be opened at a time is smaller than the case of opening the apertures from only one side of the substrate surface. Thus it is possible to reduce the diameter of the small diameter aperture 42V using the drill, which is the drill D2 with a smaller diameter than the related art, as compared to the diameter of the power supply via composed of a straight aperture of the related art.

For example, a preferable configuration is that the diameter of the small diameter aperture 42 is smaller than or equal to the diameter of the power supply via composed of the straight aperture of the related art, and the diameter of the large diameter aperture 41V is larger than the diameter of the power supply via composed of the straight aperture of the related art.

For example, in the case of a 1.0 mm pitch device and 2.5 mm of board thickness, the diameters can be designed in the following way. The diameter of the large diameter aperture 41V: about 0.3 to 0.4 mmφ (about 0.5 mmφ can be accepted depending on the case), and the diameter of the small diameter aperture 42V: about 0.1 to 0.2 mmφ.

Japanese Unexamined Patent Application Publication Nos. H10-273254, H05-327172, H09-172261, and 2008-028188, which are mentioned in the "Background" describe to provide the large diameter aperture and the small diameter aperture in the via.

In FIG. 1 of Japanese Unexamined Patent Application Publication No. H10-273254, large and small diameter aperture are provided to a ground via (16), which electrically conducts wiring (5) over one substrate surface, wiring over the other substrate, and a ground layer (2). From the wiring (5) over one substrate surface to the ground layer (2) is to be the small diameter aperture, and from the ground layer (2) to the other substrate surface is to be the large diameter aperture, so as to increase the contact area between the ground layer (2) and the grand via (16) (paragraph 0009).

Japanese Unexamined Patent Application Publication No. H05-327172 discloses a manufacturing method of a printed wiring board in which a hole for a through hole is drilled in a base material (2), a first counterboring process is performed by a tool bit for counterboring with a larger diameter than the diameter of the through hole to a position (H1), which is substantially the same distance from above the through hole to the upper edge of the through hole to be connected to another electric component, a plating process is performed to form the through hole and a conductor pattern, and the thickness of a part of the printed wiring board is reduced by performing a second counterboring process to a depth (H2) shallower than the depth of the first counterboring process (claim 1, FIGS. 1 and 2).

Japanese Unexamined Patent Application Publication No. H09-172261 discloses a manufacturing method of the multilayer printed wiring board which connects circuit patterns between three or more different layers by via holes while laminating and pressing a plurality of insulating substrates including the circuit patterns with insulating layers interposed between. In the manufacturing method, the plurality of inner layer circuit patterns each have overlapping lands in the thickness direction of a stack. Small apertures (60, 62) with the diameters getting smaller in the order from the surface side of the stack are formed over a substantially the same axis in the lands other than the bottom land. The via holes penetrating the small apertures of the plurality of lands from the surface of the stack and reaching to the bottom land are formed using laser, the via holes are plated with copper to connect the circuit patterns of different layers (claim 1, FIG. 3).

Although Japanese Unexamined Patent Application Publication Nos. H10-273254, H05-327172, and H09-172261 disclose to provide the large and small diameter apertures in the via, none of the related arts provides the large diameter aperture with the relatively large diameter formed from one substrate surface to the power plane, and the small diameter aperture with the relatively small diameter formed from the power plane to the other substrate surface for the power supply via.

As explained above, according to this embodiment, it is possible to provide the wiring board 1 that has higher wiring design flexibility and can obtain favorable impedance matching without increasing the resistance value of the power supply via 40V.

Second Embodiment

Figure 4:
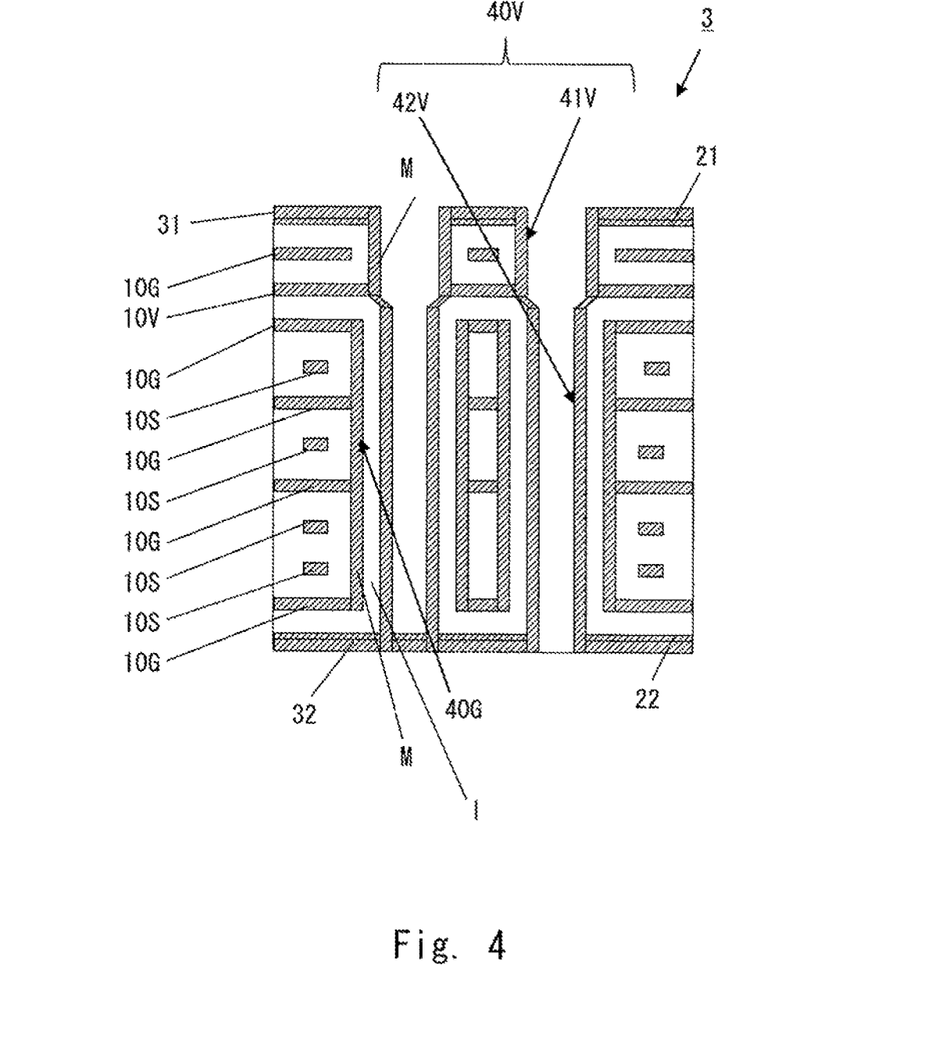
FIG. 4 is an enlarged cross-sectional diagram of a wiring board according to a second embodiment of the present invention.

A wiring board according to a second embodiment of the present invention is explained with reference to the drawings. FIG. 4 is an enlarged cross-sectional diagram of the wiring board according to this embodiment. FIGS. 5A to 5D are flow diagrams. FIG. 6 is an enlarged perspective view. FIG. 4 corresponds to FIG. 2 in the first embodiment. For better visuality, the scale of each component is appropriately changed from the actual scale. The same components as the first embodiment are denoted by the same reference numerals, and the explanation is omitted.

As shown in FIG. 4, inside a wiring board 3 of this embodiment, at least one signal layer 10S, a plurality of ground layers 10G, and at least one power plane 10V are laminated with insulating layers interposed therebetween. In the example shown, a plurality of signal layers 10S, a plurality of ground layers 10G, and one power plane 10V are formed in the wiring board 3.

As with FIG. 1 of the first embodiment, at least one semiconductor package accommodating a semiconductor device chip such as LSI is mounted to one substrate surface (top surface of FIG. 4) of the wiring board 3.

As with the first embodiment, inside the wiring board 3, there are at least one signal via (numeral omitted, same as the signal via in FIG. 1 of the first embodiment), composed of an opening in which an inner wall surface thereof is covered by a conductive material M, that electrically conducts wiring 31 over one substrate surface 21 where a semiconductor package is mounted, wiring 32 over the other substrate surface 22, and the signal layer 10S, and at least one ground via 40V, composed of an opening in which an inner wall surface thereof is covered by the conductive material M, that electrically conducts the wiring 31 over one substrate surface 21 where the semiconductor package 2 is mounted, the wiring 32 over the other substrate surface 22, and the power plane 10V.

In this embodiment, inside the wiring board 3, there are a plurality of ground vias 400, composed of an opening in which an inner wall surface thereof is covered by the conductive material M, that electrically conducts the plurality of ground layers 10G formed between the power plane 10V and the other substrate 22.

As with the first embodiment, inside the signal layer 10S of the wiring board 3, there is signal wiring (numeral omitted, same as the signal wiring 11S in FIG. 1 of the first embodiment) for performing signal transmission between the plurality of semiconductor packages.

Also in this embodiment, in a similar manner as the related art, the signal via is the straight aperture formed with the same diameter from one substrate surface 22 to the other substrate 22. On the other hand, the power supply via 40V is composed of a large diameter aperture 41V with a relatively large diameter formed from one substrate surface 21 to the power plane 10V, and a small diameter aperture 42V with a relatively small diameter formed from the power plane 10V to the other substrate surface 22.

In this embodiment, the diameter of the grand via 40G is larger than that of the small diameter aperture 42V of the power supply via 40V. Further, at least a part of the small diameter aperture 42V of the power supply via 40V is placed in the ground via 40G. The conductive material M inside the small diameter aperture 42V of the power supply via 40V is placed to oppose the conductive material M in the ground via 400 with an insulating material I interposed therebetween, and a capacitor is formed. See the perspective view of FIG. 6 for the physical relationship of the power supply via 40V and the grand via 40G.

A manufacturing method of the wiring board 3 of this embodiment is described with reference to FIGS. 5A to 5D. The wiring board 3 of this embodiment can be manufactured using the sequential lamination process.

Figure 5A:
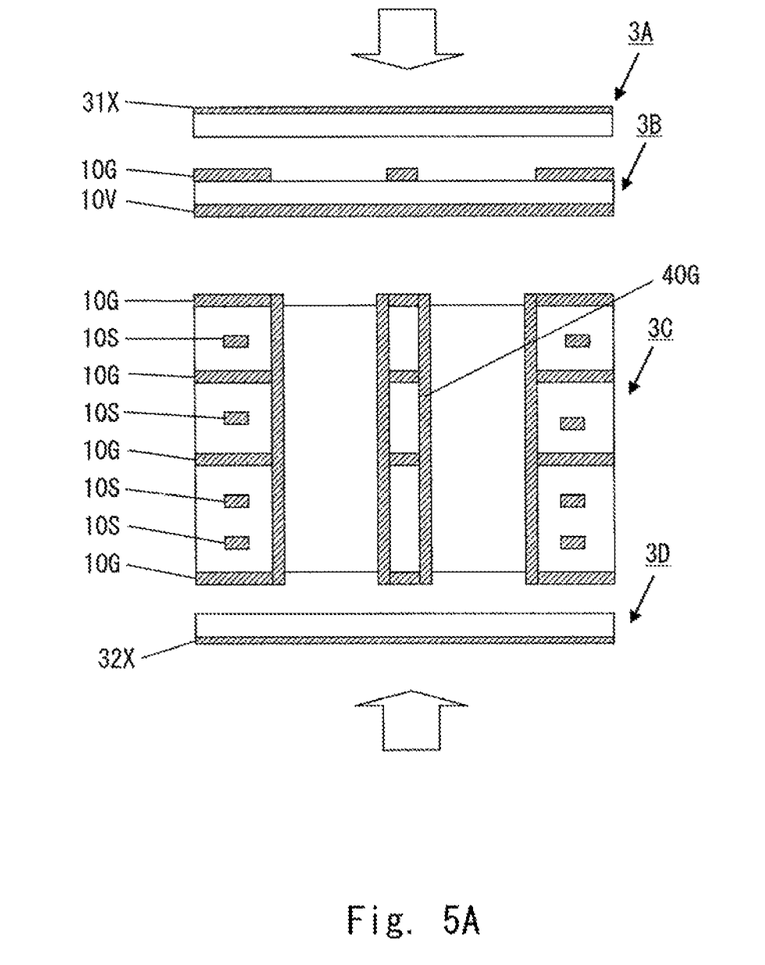
FIG. 5A is a flow diagram.
Figure 5B:
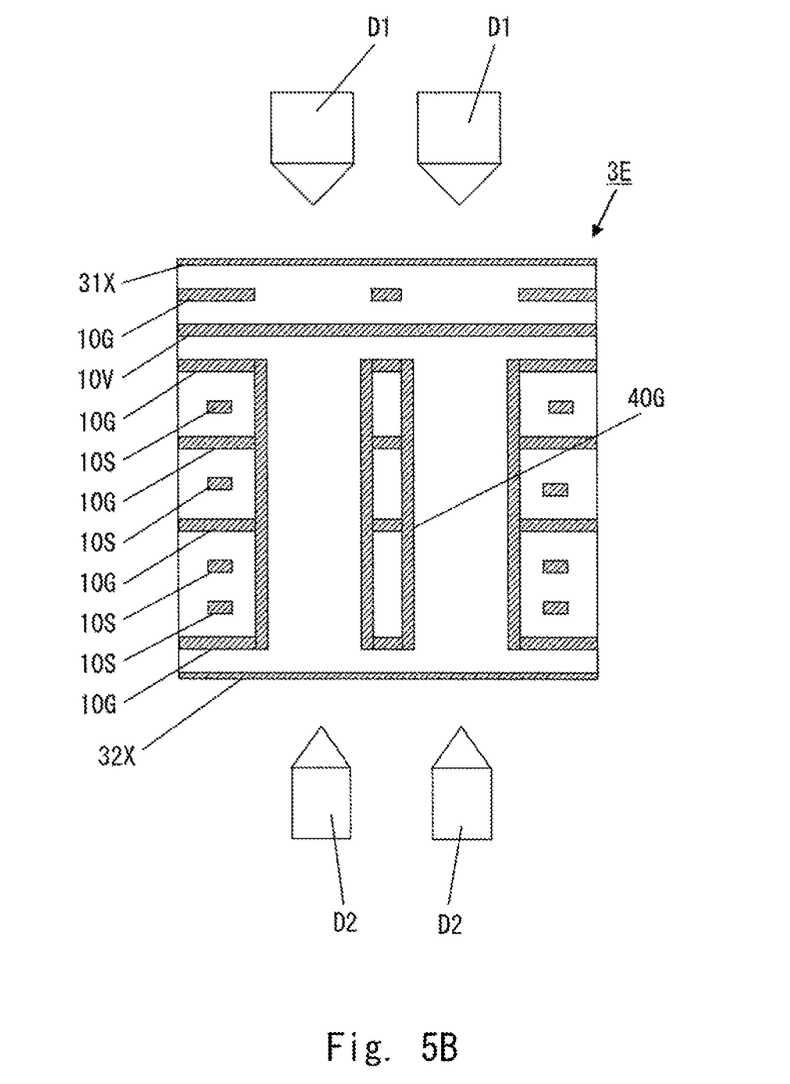
FIG. 5B is a flow diagram.
Figure 6:
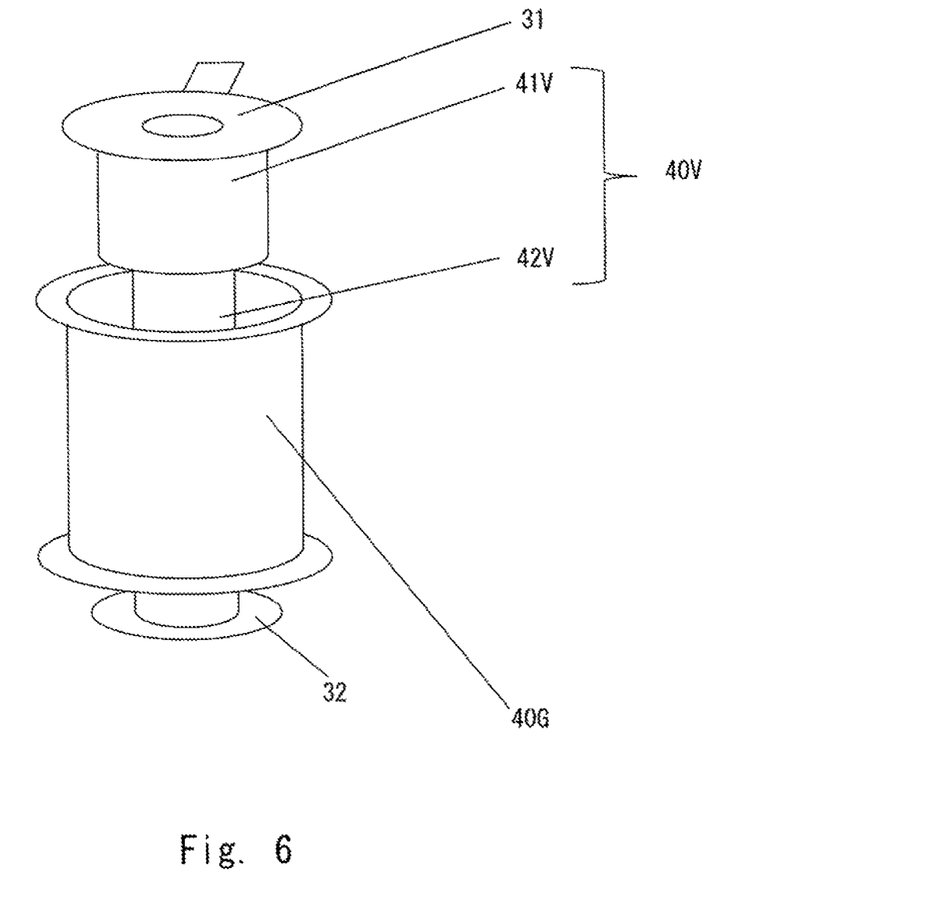
FIG. 6 is an enlarged perspective view of the wiring board shown in FIG. 4.

Wiring boards 3A to 3D shown in FIG. 5A are sequentially laminated to obtain a wiring board 3E shown in FIG. 5B. Before the sequential lamination, the ground via 400 is formed in the wiring board 3C.

Inside the wiring board 3E, at least one signal layer 10S, a plurality of ground layers 10G, at least one power plane 10V, and at least one grand via 40G are formed. The signal via and the power supply via 40V are yet to be formed in the wiring board 3E. An unpatterned wiring layer 31X is formed to one substrate surface 21, and an unpatterned wiring layer 32X is formed to the other substrate surface 22.

Next, a straight aperture is opened using a drill corresponding the hole diameter of the signal via at the formation point of the signal via of the wiring board 3 (not shown in the drawing).

Figure 5C:
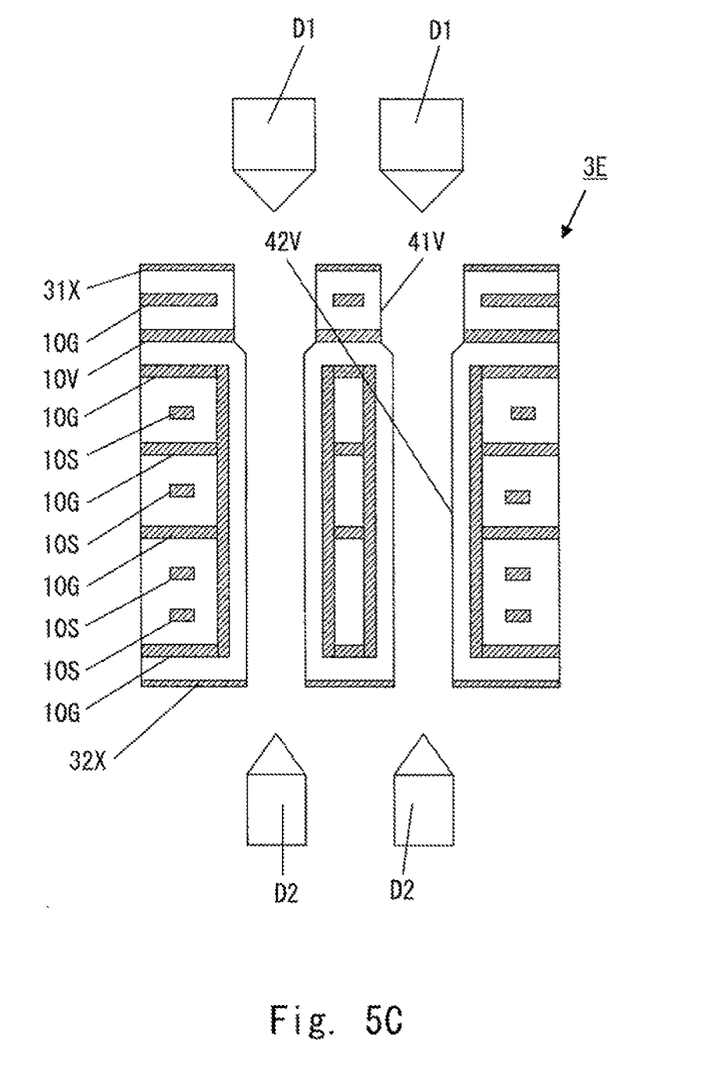
FIG. 5C is a flow diagram.

Next, as shown in FIG. 5C, the large diameter aperture 41V reaching to the power plane 10V from one substrate 21 is opened from one substrate surface 21 side at the formation point of the power supply via 40V of the wiring board 3E using a drill D1 with the same outer diameter as the inner diameter of the large diameter aperture 41.

Next, as shown in FIG. 5C, the small diameter aperture 42V is opened from the other substrate surface 22 side using a drill D2 with the same outer diameter as the inner diameter of the small diameter aperture 42V at the formation point of the power supply via 40V of the wiring board 3E.

The opening order of the aperture for the signal via, the aperture for the grand via, and the aperture for the power supply via 40V, is not limited to above but can be changed as appropriate.

Figure 5D:
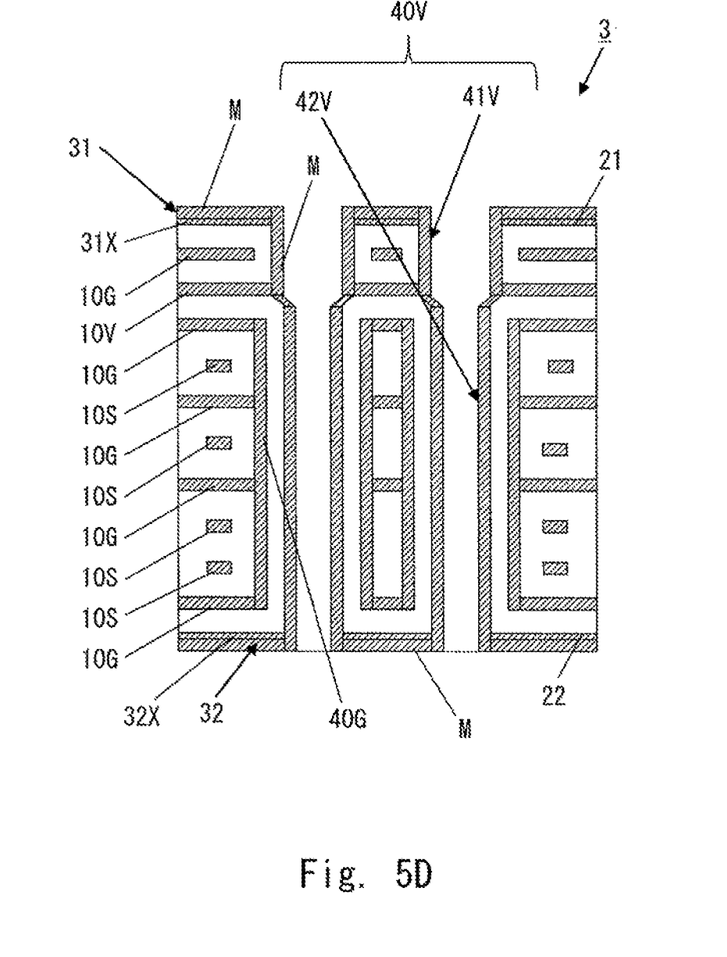
FIG. 5D is a flow diagram.

Next, as shown in FIG. 5D, the conductive material M is plated over the inner wall surface of the aperture for the signal via, the aperture for the ground via 40V, and the aperture for the power supply via 40V so as to form the signal via 40S and the power supply via 40V. In this process, the conductive material M is plated over the wiring layers 31X and 32X over the substrate surfaces 21 and 22. The wiring board 3 is manufactured as described above.

Also in the wiring board 3 of this embodiment, the power supply via 40V is composed of the large diameter aperture 41V and the small diameter aperture 42V. The large diameter aperture 41V has the relatively large diameter formed from one substrate surface 21 to the power plane 10V. The small diameter aperture 42V has the relatively small aperture formed from the power supply layer 10V to the other substrate surface 22.

In the above configuration, as the diameter of the power supply via 40V from one substrate surface 21 to the power plane 10V can be large, the resistance value of the power supply via 40V, which is a feed line, can be reduced, which is advantageous for power supply.

On the other hand, as the diameter of the power supply via 40V is small below the power plane 10V, the gap between the adjacent power supply vias 40V can be wide. Therefore, the flexibility of the wiring design of the signal layer 10S below the power plane 10V and over the other substrate surface 22 is high. Thus it is easy to match the impedance by reserving the number of wiring channels and increasing the wiring width.

The power supply via 40V composed of the large diameter aperture 41V and the small diameter aperture 42V can be easily formed by opening apertures using two kinds of the drills D1 and D2 with different diameters from the substrate surface 21 and 22 sides. At this time, as a part of the power supply via 40V is the large diameter aperture 41V, even if there is a slight deviation in the center of the large diameter aperture 41V and the small diameter aperture 42V, penetrating apertures can be easily formed. Further, in the abovementioned method, as the apertures are opened from both substrate surfaces 21 and 22, the aspect ratio of the part to be opened at a time is smaller than the case of opening the apertures from only one side of the substrate surface. Therefore, drill shooting is suppressed and the improvement effect of the yield is also achieved. Accordingly, the manufacturability of the wiring board 3 of this embodiment is also better than before.

Further, in the abovementioned method, as the apertures are formed from both substrate surfaces 21 and 22, the aspect ratio of the part to be opened at a time is smaller than the case of opening the apertures from only one side of the substrate surface. Thus it is possible to reduce the diameter of the small diameter aperture 42V using the drill, which is the drill D2 with a smaller diameter than the related art, as compared to the diameter of the power supply via composed of a straight aperture of the related art.

For example, a preferable configuration is that the diameter of the small diameter aperture 42 is smaller than or equal to the diameter of the power supply via composed of the straight aperture of the related art, and the diameter of the large diameter aperture 41V is larger than the diameter of the power supply via composed of the straight aperture of the related art.

Furthermore in this embodiment, at least a part of the small diameter aperture 42V of the power supply via 40V is placed in the ground via 40G. The conductive material M inside the small diameter aperture 42V of the power supply via 40V is placed to oppose the conductive material M in the ground via 40G with an insulating material I interposed therebetween, and a capacitor is formed, which is favorable.

FIG. 6 or the like in Japanese Unexamined Patent Application Publication No. 2008-028188 mentioned in "Background" discloses to double the via to have more capacitors. However, Japanese Unexamined Patent Application Publication No. 2008-028188 does not mention to provide the large diameter aperture and the small diameter aperture.

As explained above, according to this embodiment, it is possible to provide the wiring board 3 that has higher wiring design flexibility and can obtain favorable impedance matching without increasing the resistance value of the power supply via 40V.

(Other Design Variation)

The present invention is not limited to the above embodiments, but appropriate design variation can be made within the scope of the present invention.

The present invention can provide a wiring board that is capable of favorably obtaining impedance matching with high design flexibility of wiring without increasing the resistance of the power supply via.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A wiring board comprising:
   at least one signal layer;
   at least one ground layer;
   at least one power plane;
   at least one power supply via that is composed of an opening in which an inner wall surface is covered by a conductive material, the power supply via electrically conducting wiring over one substrate surface where at least one semiconductor device chip is mounted, wiring over another substrate surface, and the power plane; and
   signal wiring for performing signal transmission between a plurality of semiconductor device chips,
   wherein the power plane is placed to the one substrate surface side than the signal wiring, and
   the power supply via is composed of a large diameter aperture and a small diameter aperture, the large diameter aperture having a relatively large diameter and being formed from the one substrate surface to the power plane, and the small diameter aperture having a relatively small diameter and being formed from the power plane to the other substrate surface.

2. The wiring board according to claim 1, further comprising:
   a plurality of ground layers between the power plane and the other substrate surface; and
   a plurality of ground vias that electrically conduct the plurality of ground layers each other, have a diameter larger than the small diameter aperture, and are composed of an opening in which an inner wall surface is covered by a conductive material,
   wherein at least a part of the small diameter aperture is placed in the ground via, and the conductive material in the small diameter aperture of the power supply via is placed to oppose the conductive material in the ground via with an insulating material interposed therebetween.

* * * * *